(12) United States Patent
Negley et al.

(10) Patent No.: US 7,183,587 B2
(45) Date of Patent: Feb. 27, 2007

(54) SOLID METAL BLOCK MOUNTING SUBSTRATES FOR SEMICONDUCTOR LIGHT EMITTING DEVICES

(75) Inventors: Gerald H. Negley, Hillsborough, NC (US); Ban Loh, Durham, NC (US)

(73) Assignee: Cree, Inc., Durham, NC (US)

(*) Notice: Subject to any disclaimer, the term of this patent is extended or adjusted under 35 U.S.C. 154(b) by 153 days.

(21) Appl. No.: 10/659,108

(22) Filed: Sep. 9, 2003

(65) Prior Publication Data
US 2005/0051789 A1  Mar. 10, 2005

(51) Int. Cl.
*H01L 29/22* (2006.01)

(52) U.S. Cl. .................. 257/99; 438/26; 257/E33.057; 257/98

(58) Field of Classification Search ............ 257/98–99, 257/95, 81–82, 91, 676, E33.068, E33.067, 257/680, E25.032; 438/110, 22, 29; 361/600, 361/706, 707
See application file for complete search history.

(56) References Cited

U.S. PATENT DOCUMENTS

| | | | |
|---|---|---|---|
| 4,042,552 A | | 8/1977 | Grucza |
| 4,107,238 A | | 8/1978 | Roper et al. |
| 4,141,941 A | | 2/1979 | Travnicek |
| 4,562,018 A | | 12/1985 | Neefe |
| 4,650,922 A | * | 3/1987 | McPherson ............... 174/52.4 |
| 4,794,048 A | * | 12/1988 | Oboodi et al. ............. 428/432 |
| 4,826,424 A | | 5/1989 | Arai et al. |
| 4,918,497 A | | 4/1990 | Edmond |
| 4,935,665 A | * | 6/1990 | Murata ..................... 313/500 |
| 4,966,862 A | | 10/1990 | Edmond |
| 5,024,966 A | * | 6/1991 | Dietrich et al. .............. 438/23 |
| 5,027,168 A | | 6/1991 | Edmond |
| 5,087,949 A | | 2/1992 | Haitz |
| 5,110,278 A | | 5/1992 | Tait et al. |

(Continued)

FOREIGN PATENT DOCUMENTS

EP  0 439 227 A1  7/1991

(Continued)

OTHER PUBLICATIONS

Aavid Thermalloy, LLC, *Extrusion Profiles*, retrieved Oct. 18, 2004 from http://www.aavidthermalloy.com/products/extrusion/index.shtml.

(Continued)

*Primary Examiner*—Thao X. Le
(74) *Attorney, Agent, or Firm*—Myers Bigel Sibley & Sajovec, P.A.

(57) ABSTRACT

A mounting substrate for a semiconductor light emitting device includes a solid metal block having a cavity in a face thereof that is configured for mounting a semiconductor light emitting device therein. An insulating coating is provided in the cavity, and first and second spaced apart conductive traces are provided on the insulating coating in the cavity that are configured for connection to a semiconductor light emitting device. The mounting substrate may be fabricated by providing a solid aluminum block including a cavity in a face thereof that is configured for mounting a semiconductor light emitting device therein. The solid aluminum block is oxidized to form an aluminum oxide coating thereon. The first and second spaced apart electrical traces are fabricated on the aluminum oxide coating in the cavity.

28 Claims, 6 Drawing Sheets

U.S. PATENT DOCUMENTS

| | | | |
|---|---|---|---|
| 5,143,660 A | 9/1992 | Hamilton et al. | |
| 5,210,051 A | 5/1993 | Carter, Jr. | |
| 5,277,840 A | 1/1994 | Osaka et al. | |
| 5,298,768 A * | 3/1994 | Okazaki et al. | 257/81 |
| 5,338,944 A | 8/1994 | Edmond et al. | |
| 5,374,668 A | 12/1994 | Kanemura et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,739,554 A | 4/1998 | Edmond et al. | |
| 5,753,730 A | 5/1998 | Nagata et al. | |
| 5,813,753 A | 9/1998 | Vriens et al. | |
| 5,851,063 A | 12/1998 | Doughty et al. | |
| 5,858,278 A | 1/1999 | Itoh et al. | |
| 5,882,553 A | 3/1999 | Prophet et al. | |
| 5,912,477 A | 6/1999 | Negley | |
| 5,959,316 A | 9/1999 | Lowery | |
| 5,968,422 A | 10/1999 | Kennedy | |
| 6,060,729 A * | 5/2000 | Suzuki et al. | 257/99 |
| 6,066,861 A | 5/2000 | Höhn et al. | |
| 6,069,440 A | 5/2000 | Shimizu et al. | |
| 6,120,600 A | 9/2000 | Edmond et al. | |
| 6,156,242 A | 12/2000 | Saito et al. | |
| 6,177,688 B1 | 1/2001 | Linthicum et al. | |
| 6,184,544 B1 * | 2/2001 | Toda et al. | 257/98 |
| 6,187,606 B1 | 2/2001 | Edmond et al. | |
| 6,201,262 B1 | 3/2001 | Edmond et al. | |
| 6,219,223 B1 * | 4/2001 | Kobayashi et al. | 361/525 |
| 6,252,254 B1 | 6/2001 | Soules et al. | |
| 6,329,676 B1 | 12/2001 | Takayama et al. | |
| 6,373,188 B1 | 4/2002 | Johnson et al. | |
| 6,383,417 B1 | 5/2002 | Paulson et al. | |
| 6,391,231 B1 | 5/2002 | Evans et al. | |
| 6,404,125 B1 | 6/2002 | Garbuzov et al. | |
| 6,480,389 B1 * | 11/2002 | Shie et al. | 361/707 |
| 6,498,355 B1 | 12/2002 | Harrah et al. | |
| 6,531,328 B1 * | 3/2003 | Chen | 438/26 |
| 6,562,643 B2 * | 5/2003 | Chen | 438/26 |
| 6,599,768 B1 * | 7/2003 | Chen | 438/22 |
| 6,639,356 B2 * | 10/2003 | Chin | 313/499 |
| 6,686,609 B1 * | 2/2004 | Sung | 257/100 |
| 6,707,069 B2 * | 3/2004 | Song et al. | 257/79 |
| 6,744,077 B2 | 6/2004 | Trottier | |
| 6,783,362 B2 * | 8/2004 | Cao | 433/29 |
| 6,791,151 B2 * | 9/2004 | Lin et al. | 257/434 |
| 6,824,294 B2 * | 11/2004 | Cao | 362/231 |
| 2002/0123164 A1 | 9/2002 | Slater, Jr. et al. | |
| 2003/0006418 A1 | 1/2003 | Emerson et al. | |
| 2003/0032212 A1 * | 2/2003 | Wang et al. | 438/48 |
| 2003/0067264 A1 * | 4/2003 | Takekuma | 313/501 |
| 2003/0080341 A1 * | 5/2003 | Sakano et al. | 257/79 |
| 2003/0098459 A1 | 5/2003 | Horiuchi et al. | |
| 2003/0153861 A1 | 8/2003 | Royer | |
| 2003/0173575 A1 | 9/2003 | Eisert et al. | |
| 2004/0041222 A1 | 3/2004 | Loh | |
| 2004/0041757 A1 * | 3/2004 | Yang et al. | 345/82 |
| 2004/0056260 A1 | 3/2004 | Slater, Jr. et al. | |
| 2004/0079957 A1 * | 4/2004 | Andrews et al. | 257/100 |
| 2004/0095738 A1 * | 5/2004 | Juang | 361/815 |
| 2004/0211970 A1 * | 10/2004 | Hayashimoto et al. | 257/98 |
| 2004/0222433 A1 * | 11/2004 | Mazzochette et al. | 257/99 |

FOREIGN PATENT DOCUMENTS

| | | |
|---|---|---|
| JP | 5-152609 A | 6/1993 |
| JP | 6-151974 A | 5/1994 |
| JP | 6-177429 A | 6/1994 |
| JP | 6-244458 A | 9/1994 |
| JP | 08-116095 A | 5/1996 |
| JP | 8-162676 A | 6/1996 |
| JP | 09-083018 A | 3/1997 |
| JP | 9-246603 A | 9/1997 |
| JP | 10-098215 A | 4/1998 |
| JP | 10-242513 A | 9/1998 |
| JP | 11-261114 A | 9/1999 |
| JP | 11-298047 A | 10/1999 |
| JP | 2000-101147 A | 4/2000 |
| JP | 2000-174347 A | 6/2000 |
| JP | 2000-183405 A | 6/2000 |
| JP | 2000-286455 A | 10/2000 |
| JP | 2000-286458 A | 10/2000 |
| JP | 2001-77427 A | 3/2001 |
| JP | 2001-77433 A | 3/2001 |
| JP | 2001-144334 A | 5/2001 |
| JP | 2001-230453 A | 8/2001 |
| JP | 2002-118293 A | 4/2002 |
| JP | 2002-158378 A | 5/2002 |
| JP | 2002-223004 A | 8/2002 |
| JP | 2002-280616 A | 9/2002 |
| JP | 2003-17755 A | 1/2003 |
| JP | 2003-318448 A | 11/2003 |
| WO | WO 97/24706 A2 | 7/1997 |
| WO | WO 97/24706 A3 | 7/1997 |
| WO | WO 01/61764 A1 | 8/2001 |
| WO | WO 02/059982 A1 | 8/2002 |

OTHER PUBLICATIONS

Heatron, *ELPOR® Product Information*, retrieved Oct. 6, 2004 from http://www.heatron.com.

Heatron, *Metal Core PCBs for LED Light Engines* (Product Brochure), retrieved from http://www.heatron.com.

IRC Advanced Film Division, *Thick Film Application Specific Capabilities* (Product Brochure), retrieved from http://www.irctt.com, copyright 2002.

IRC Advanced Film Division, *Insulated Aluminum Substrates* (Product Brochure) retrieved from http://www.irctt.com, copyright 2002.

Morris, *IRC's Anotherm™ PC Boards Eliminate Heat for Automotive LED Applications*, Mar. 16, 2004 Press Release, retrieved Sep. 17, 2004 from http://www.irctt.com/pages/Anotherm_PressRelease.cfm.

Andrews, *Methods for Packaging A Light Emitting Devices*, U.S. Appl. No. 60/557,924, filed Mar. 31, 2004.

Andrews, *Reflector Packages and Methods for Packaging of a Semiconductor Light Emitting Devices*, U.S. Appl. No. 60/558,314, filed Mar. 31, 2004.

Cabot Corporation, *Using Nanogel in Daylighting Systems*, retrieved Jan. 11, 2005 from http://w1.cabot-corp.com/Controller.jsp?. . . .

Cree, Inc., *Cree Optoelectronics LED Product Line*, Publication CPR3AX, Rev. D, 2001-2002.

Negley et al., *Light Emitting Diode Arrays for Direct Backlighting of Liquid Crystal Displays*, U.S. Appl. No. 11/022,332, filed Dec. 23, 2004.

Negley et al., *Methods of Coating Semiconductor Light Emitting Elements by Evaporating Solvent From a Suspension*, U.S. Appl. No. 10/946,587, filed Sep. 21, 2004.

Negley et al., *Transmissive Optical Elements Including Transparent Plastic Shell Having a Phosphor Dispersed Therein, and Methods of Fabricating Same*, U.S. Appl. No. 10/659,240, filed Sep. 9, 2003.

Negley, *Reflective Optical Elements for Semiconductor Light Emitting Devices*, U.S. Appl. No. 10/898,608, filed Jul. 23, 2004.

Negley, *Semiconductor Light Emitting Device Mounting Substrates and Packages Including Cavities and Cover Plates, and Methods of Packaging Same*, U.S. Appl. No. 11/011,748, filed Dec. 14, 2004.

Negley, *Semiconductor Light Emitting Devices Including Patternable Films Comprising Transparent Silicone and Phosphor, and Methods of Manufacturing Same*, U.S. Appl. No. 10/947,704, filed Sep. 23, 2004.

Negley, *Solid Metal Block Semiconductor Light Emitting Devices Mounting Substrates and Packages Including Cavities and Heat Sinks, and Methods of Packaging Same*, U.S. Appl. No. 10/972,910, filed Oct. 25, 2004.

Notification of Transmittal of The International Search Report and The Written Opinion of the International Searching Authority, or the Declaration, International Search Report and Written Opinion of the International Searching Authority, PCT/US2004/017325, Sep. 28, 2004.

Craford, *Overview of Device Issues in High-Brightness Light-Emitting Diodes*, Chapter, *High Brightness Light Emitting Diodes: Semiconductors and Semimetals*, vol. 48, Stringfellow et al. ed., Academic Press, 1997, pp. 47-63.

Loh, *Power Surface Mount Light Emitting Die Package*, U.S. Appl. No. 10/446,532, May 27, 2003.

Slater, Jr. et al., *Phosphor-Coated Light Emitting Diodes Including Tapered Sidewalls and Fabrication Methods Therefor*, U.S. Appl. No. 60/411,980, Sep. 19, 2002.

International Search Report, PCT/US03/27912, Jan. 30, 2004.

\* cited by examiner

SOLID METAL BLOCK MOUNTING SUBSTRATES FOR SEMICONDUCTOR LIGHT EMITTING DEVICES

FIELD OF THE INVENTION

This invention relates to semiconductor light emitting devices and fabricating methods therefor, and more particularly to packaging and packaging methods for semiconductor light emitting devices.

BACKGROUND OF THE INVENTION

Semiconductor light emitting devices, such as Light Emitting Diodes (LEDs) or laser diodes are widely used for many applications. As is well known to those having skill in the art, a semiconductor light emitting device includes one or more semiconductor layers that are configured to emit coherent and/or incoherent light upon energization thereof. It is also known that the semiconductor light emitting device generally is packaged to provide external electrical connections, heat sinking, lenses or waveguides, environmental protection and/or other functions.

For example, it is known to provide a two-piece package for a semiconductor light emitting device wherein the semiconductor light emitting device is mounted on a substrate that comprises alumina, aluminum nitride and/or other materials, which include electrical traces thereon, to provide external connections for the semiconductor light emitting device. A second substrate which may comprise silver plated copper, is mounted on the first substrate, for example using glue, surrounding the semiconductor light emitting device. A lens may be placed on the second substrate over the semiconductor light emitting device. Light emitting diodes with two-piece packages as described above are described in application Ser. No. 10/446,532 to Loh, entitled *Power Surface Mount Light Emitting Die Package,* filed May 27, 2003, assigned to the assignee of the present invention, the disclosure of which is hereby incorporated herein by reference in its entirety as if set forth fully herein.

Unfortunately, these substrates may be costly and, in some case, more costly than the semiconductor light emitting device themselves. Moreover, the fabrication process may also be costly, time consuming and/or subject to failures due to the number of steps therein.

SUMMARY OF THE INVENTION

Some embodiments of the present invention provide a mounting substrate for a semiconductor light emitting device that comprises a solid metal block including a cavity in a face thereof that is configured for mounting a semiconductor light emitting device therein. In other embodiments, an insulating coating is provided on a surface of the solid metal block. In still other embodiments, the insulating coating is in the cavity, and first and second spaced apart conductive traces are provided on the insulating coating in the cavity that are configured for connection to a semiconductor light emitting device.

In some embodiments, the first and second spaced apart conductive traces extend from the cavity to the first face around at least one side of the metal block and onto a second, opposite face of the metal block. In other embodiments, the solid metal block includes therein first and second through holes that extend from the first face to the second face of the metal block. A respective through hole includes a respective conductive via therein that extends from the first face to the second face. A respective one of the spaced apart conductive traces is electrically connected to a respective one of the conductive vias.

In some embodiments, the solid metal block is a solid aluminum block, and the insulating coating comprises aluminum oxide. The insulating coating may be formed by oxidizing the aluminum as will be described below. In these embodiments, the respective first and second through holes also include an insulating coating thereon that comprises aluminum oxide, so that the first and second conductive vias therein are insulated from the aluminum block.

Mounting substrates according to embodiments of the present invention may be combined with a semiconductor light emitting device that is mounted in the cavity and is connected to the first and second spaced apart conductive traces. A lens may be provided that extends across the cavity. In some embodiments, an encapsulant is provided between the semiconductor light emitting device and the lens. In other embodiments, a lens retainer may be provided on the substrate that is configured to hold the lens across the cavity.

Other embodiments of the present invention fabricate a mounting substrate for a semiconductor light emitting device by providing a solid aluminum block including a cavity in a face thereof that is configured for mounting a semiconductor light emitting device therein. The solid aluminum block is oxidized to form an aluminum oxide coating thereon. First and second spaced apart electrical traces are fabricated on the aluminum oxide coating in the cavity and are configured for connection of a semiconductor light emitting device thereto.

In some embodiments, the aluminum block also includes first and second through holes that extend therethrough. The first and second through holes are oxidized when oxidizing the second aluminum block, to form an aluminum oxide coating in the first and second through holes. First and second conductive vias are fabricated in the respective first and second through holes that are coated with aluminum oxide. In other embodiments, when fabricating the first and second spaced apart conductive traces, the traces are fabricated to extend from the cavity to the first face around at least one side of the metal block and onto a second face of the metal block that is opposite the first face.

In some embodiments, a semiconductor light emitting device is mounted in the cavity and connected to the first and second spaced apart conductive traces. In some embodiments, a lens is mounted across the cavity and, in some embodiments, an encapsulant is provided between the semiconductor light emitting device and the lens.

DETAILED DESCRIPTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface of a conductive line, is referred to as "outer," it is closer to the outside of the device than other parts of the element. Furthermore, relative terms such as "beneath" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements.

Figure 1A:
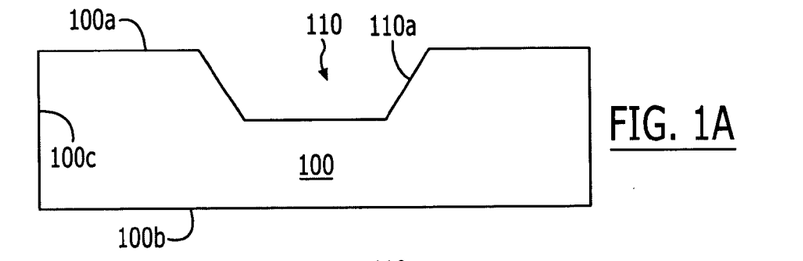
FIGS. 1A–1H are side cross-sectional views of mounting substrates for semiconductor light emitting devices according to various embodiments of the present invention.

FIGS. 1A–1H are side cross-sectional views of mounting substrates for semiconductor light emitting devices according to various embodiments of the present invention. Referring to FIG. 1A, mounting substrates for semiconductor light emitting devices according to some embodiments of the invention include a solid metal block 100 including a cavity 110 in a first face 110a thereof, that is configured for mounting a semiconductor light emitting device therein. In some embodiments, the solid metal block 100 comprises a solid aluminum block. The cavity 110 may be formed by machining, coining, etching and/or other conventional techniques. The size and shape of the cavity 110 may be configured to improve or optimize the amount and/or direction of light that is emitted by a semiconductor light emitting device that is mounted in the cavity 110. For example, oblique sidewalls 110a and or a semi-ellipsoidal cross-sectional profile may be provided. In some embodiments, the metal block 100 may be a rectangular solid metal block of aluminum about 6 mm×about 9 mm, and about 2 mm thick, and the cavity 110 may be about 1.2 mm deep with a circular floor that is about 2.5 mm in diameter, with sidewalls 110a that are of any simple or complex shape to obtain desired radiation patterns. However, the block 100 may have other polygonal and/or ellipsoidal shapes.

Figure 1B:
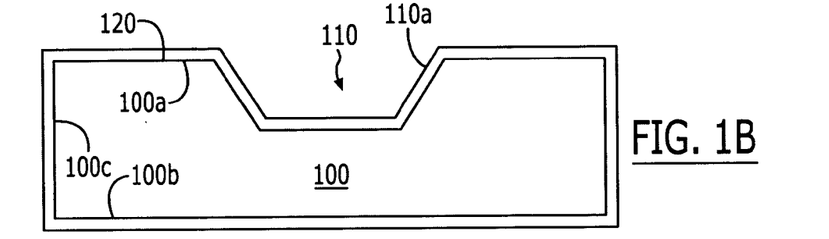

FIG. 1B illustrates mounting substrates according to other embodiments of the present invention. As shown in FIG. 1B, an insulating coating is provided on the surface of the solid metal block 100. The insulating coating 120 may be provided on the entire exposed surface of the solid metal block as shown in FIG. 1B, or on only a portion of the exposed surface of the solid metal block. In some embodiments, as will be described below, the insulating coating 120 comprises a thin layer of aluminum oxide ($Al_2O_3$) that may be formed, for example, by anodic oxidation of the solid aluminum block 100. In other embodiments, the coating 120 is sufficiently thick to provide an insulator, but is sufficiently thin to minimize the thermal conductive path therethrough.

Figure 1C:
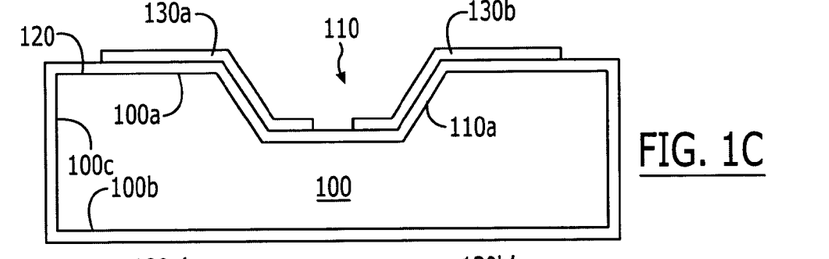

Referring now to FIG. 1C, first and second spaced apart conductive traces 130a, 130b are provided on the insulating coating 120 in the cavity 110. The first and second spaced apart conductive traces 130a, 130b are configured for connection to a semiconductor light emitting device. As shown in FIG. 1C, in some embodiments, the first and second spaced apart conductive traces 130a and 130b can extend from the cavity 110 onto the first face 100a of the solid metal block 100. When the insulating coating 120 is provided on only a portion of the solid metal block 100, it may be provided between the first and second spaced apart traces 130a and 130b and the solid metal block 100, to thereby insulate the first and second metal traces 130a and 130b from the solid metal block 100.

Figure 1D:
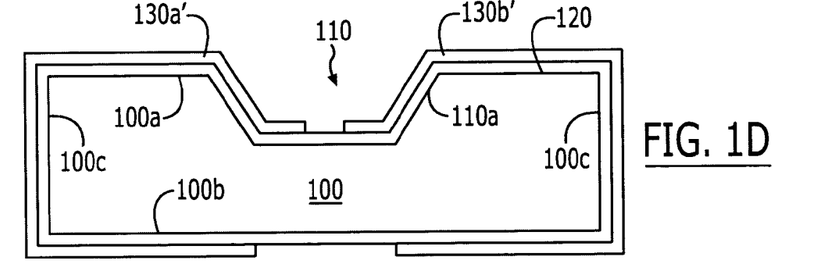

FIG. 1D illustrates other embodiments of the present invention wherein the first and second spaced apart conductive traces 130a', 130b' extend from the cavity 110 to the first face 100a around at least one side 100c of the metal block and onto a second face 100b of the metal block that is opposite the first face 100a. Thus, backside contacts may be provided.

Figure 1E:
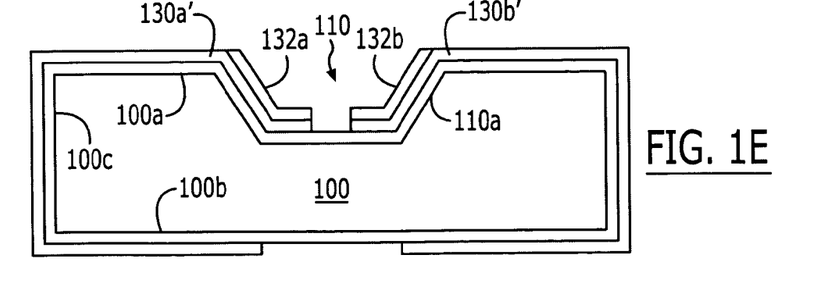

In some embodiments of the invention, the first and second spaced apart conductive traces 130a, 130b and/or 130a', 130b' comprise metal and, in some embodiments, a reflective metal such as silver. In other embodiments, as shown in FIG. 1E, separate reflective layers 132a, 132b may be provided on the spaced apart conductive traces 130a', 130b' in the cavity 110. In these embodiments, the conductive traces 130a', 130b' may comprise copper, and the reflective traces 132a, 132b may comprise silver.

Figure 1F:
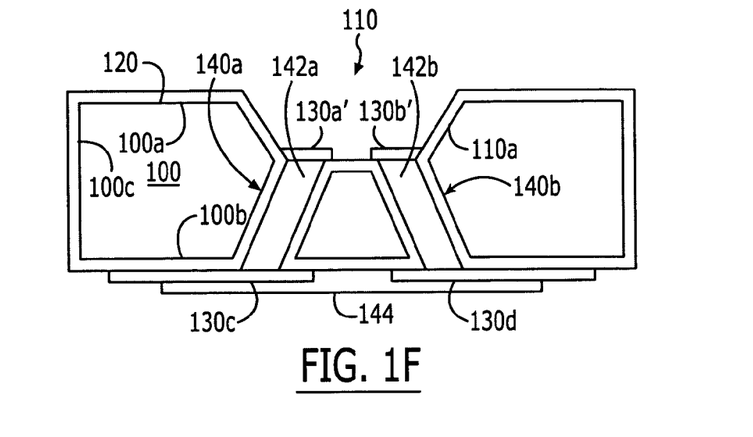

In still other embodiments of the present invention, as illustrated in FIG. 1F, backside contacts may be provided by providing first and second through holes 140a and 140b, which may be formed in the solid metal block 100 by machining, etching and/or other conventional techniques. Moreover, as shown in FIG. 1F, the insulating coating 120 extends into the through holes 140a and 140b. First and second conductive vias 142a, 142b are provided in the first and second through holes 140a, 140b, and are insulated from the solid metal block 100 by the insulating coating 120 in through holes 140a, 140b.

In FIG. 1F, the through holes 140a and 140b, and the conductive vias 142a and 142b extend from the cavity 110 to the second face 100b. The through holes 140a, 140b may be orthogonal and/or oblique to the first and second faces 100a, 100b. First and second spaced apart conductive traces 130a', 130b' may be provided in the cavity 110, and electrically connected to the respective first and second conductive vias 142a, 142b. On the second face 100b, third and fourth spaced apart conductive traces 130c, 130d also may be provided that are electrically connected to the respective first and second conductive vias 142a, 142b. A solder mask layer 144 may be provided in some embodiments to isolate the third and fourth conductive traces 130c, 130d on the second face 100b, to facilitate circuit board assembly. Solder mask layers 144 are well known to those having skill in the art and need not be described further herein.

In embodiments of FIG. 1F, the first and second through holes 140a, 140b and the first and second conductive vias 142a, 142b extended from the cavity 110 to the second face 100b. In embodiments of FIG. 1G, the first and second through holes 140a', 140b' and the first and second conductive vias 142a', 142b' extend from the first face 100a outside the cavity 110 to the second face 100b. The through holes 140a', 140b' may be orthogonal and/or oblique to the first and second faces 100a, 100b. First and second spaced apart conductive traces 130a", 130b" extend from the cavity 110 to the respective first and second conductive vias 142a', 142b' on the first face 100a. Third and fourth traces 130c', 130d' are provided on the second face 100b that electrically connect to the respective first and second conductive via 142a', 142b'.

Figure 1G:
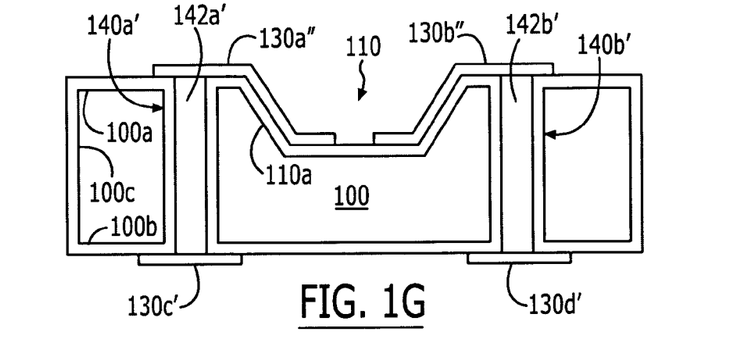
Figure 1H:
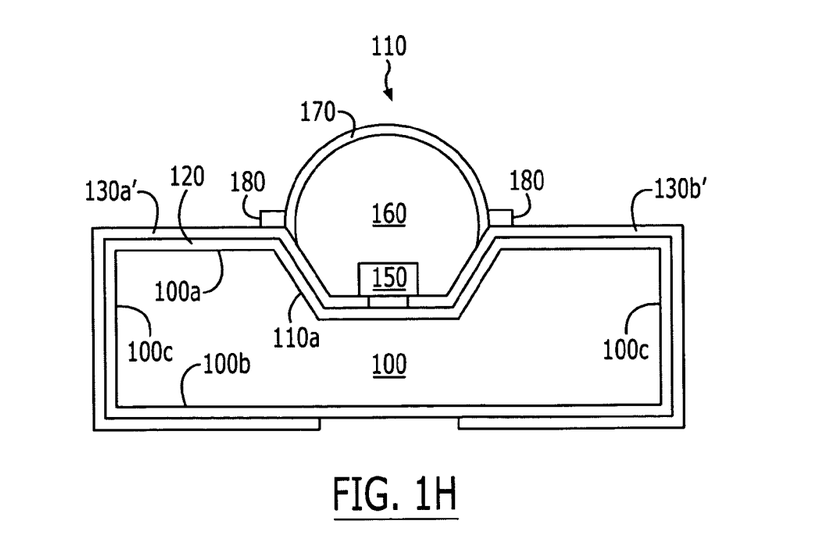

FIG. 1H illustrates embodiments of the invention that were described in connection with FIG. 1D, and which further include a semiconductor light emitting device 150 that is mounted in the cavity and that is connected to the first and second spaced apart electrical traces 130a', 130b'. Moreover, FIG. 1H illustrates that in other embodiments, a lens 170 extends across the cavity. In still other embodiments, an encapsulant 160 is provided between the semiconductor light emitting device 150 and the lens 170. The encapsulant 160 may comprise clear epoxy and can enhance optical coupling from the semiconductor light emitting device 150 to the lens 170. In still other embodiments, a lens retainer 180 is provided on the solid metal block 100, to hold the lens 170 across the cavity 110.

Embodiments of light emitting devices 150, encapsulants 160 and lenses 170 that may be used in various embodiments of the present invention are described in U.S. patent application Ser. No. 10/659,240, entitled Transmissive Optical Elements Including Transparent Plastic Shell Having a Phosphor Dispersed Therein, and Methods of Fabricating Same, to Negley et al., filed concurrently and assigned to the assignee of the present application, the disclosure of which is hereby incorporated by reference in its entirety as if set forth fully herein.

It will be understood by those having skill in the art that, although the embodiments of FIGS. 1F–1H have been illustrated as separate embodiments, various elements of FIGS. 1A–1H may be used together to provide various combinations and/or subcombinations of elements. Thus, for example, the reflective layer 132a, 132b may be used in any of the embodiments shown, and the semiconductor light emitting device 150, lens 170, encapsulant 160 and/or the lens retainer 180 may be used in any of the embodiments shown. Accordingly, the present invention should not be limited to the separate embodiments that are shown in FIGS. 1A–1H.

Figure 2:
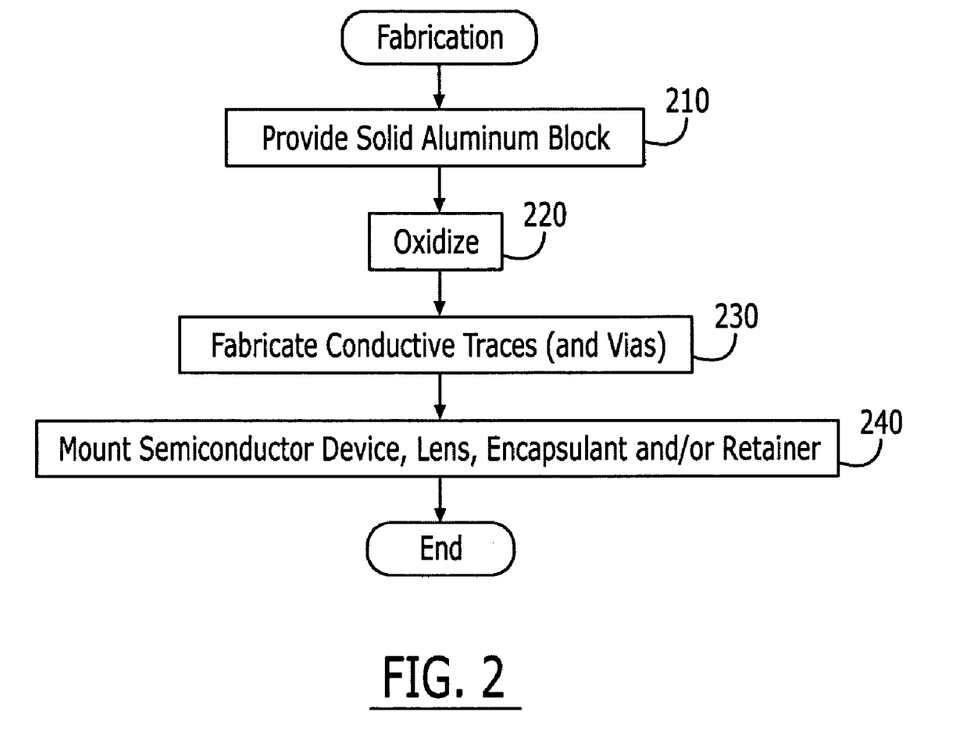
FIG. 2 is a flowchart of steps that may be performed to fabricate mounting substrates for semiconductor light emitting devices according to various embodiments of the present invention.

FIG. 2 is a flowchart of steps that may be performed to fabricate semiconductor light emitting devices according to various embodiments of the present invention. Referring to FIG. 2, as shown at Block 210, a solid aluminum block, such as aluminum block 100 of FIGS. 1A–1H, is provided including a cavity, such as cavity 110, in a face thereof, that is configured for mounting a semiconductor light emitting device therein. As was described above, the cavity may be provided by machining, coining, etching and/or other conventional techniques. Moreover, in other embodiments, the solid aluminum block may also contain the first and second spaced apart through holes such as through holes 140a, 140b and/or 140a', 140b' that extend therethrough, and which may be fabricated by machining, etching and/or other conventional techniques.

Referring again to FIG. 2, at Block 220, the solid aluminum block is oxidized to form an aluminum oxide coating thereon. In some embodiments, the entire exposed surface of the solid aluminum block is oxidized. Moreover, when through holes are provided, the inner surfaces of the through holes also may be oxidized. In other embodiments, only portions of the aluminum block are oxidized, for example, by providing a masking layer on those portions which are desired not to be oxidized. Oxidization of aluminum is well known to those having skill in the art and may be performed, for example, using an anodic oxidation processes and/or other oxidation processes, to provide a thin layer of $Al_2O_3$ on the aluminum.

Still referring to FIG. 2, at Block 230, first and second spaced apart conductive traces, such as traces 130a, 130b and/or 130a', 130b', are fabricated in the cavity on the first face, on the sides and/or on the second face, depending on the configuration, as was described above. Moreover, in some embodiments, conductive vias, such as vias 142a, 142b and/or 142a', 142b' may be fabricated in through holes. The conductive vias may be fabricated prior to, concurrent with and/or after the conductive traces. The fabrication of conductive traces on an aluminum core that is oxidized with aluminum oxide is well known to provide circuit board-like structures with an aluminum core, and accordingly need not be described in detail herein.

Finally, at Block 240, other operations are performed to mount the semiconductor device, lens, encapsulant and/or retainer on the substrate.

Figure 3A:
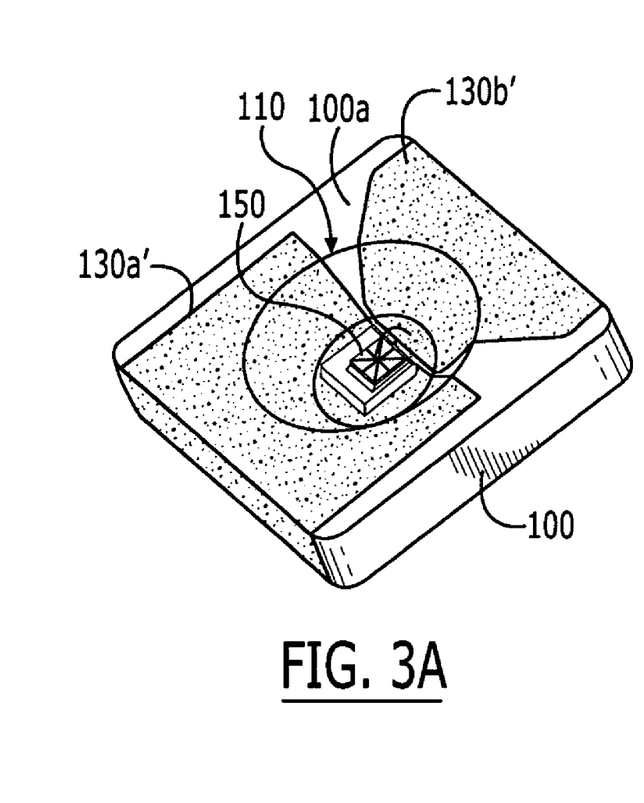
FIGS. 3A and 3B are top and bottom perspective views of a mounting substrate for semiconductor light emitting devices according to embodiments of the present invention.
Figure 3B:
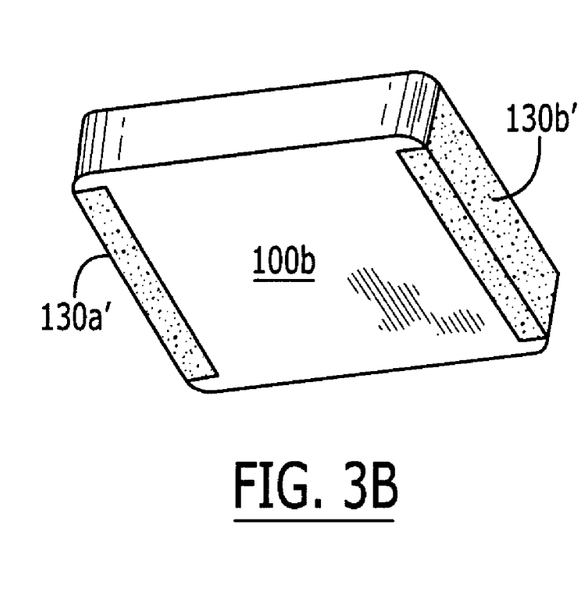

FIGS. 3A and 3B are top and bottom perspective views, respectively, of mounting substrates according to embodiments of the present invention, which may correspond to the cross-sectional view of FIG. 1D. FIGS. 3A and 3B illustrate the solid metal block 100, the first and second spaced apart conductive traces 130a', 130b' that wrap around the solid metal block, and the semiconductor light emitting device 150 mounted in the cavity 110. The insulating coating 120 may be transparent and is not shown. A second insulating layer and/or solder mask may be provided on the first and/or second spaced apart conductive traces in these and/or any other embodiments.

Figure 4:
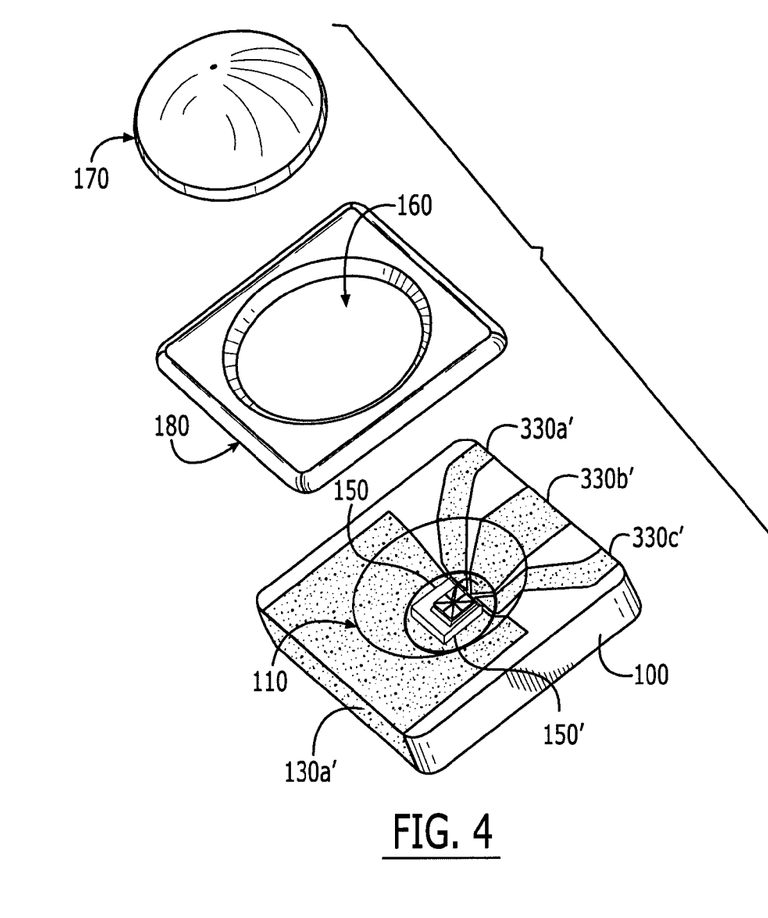
FIG. 4 is an exploded perspective view of a packaged semiconductor light emitting device according to embodiments of the present invention.
Figure 5:
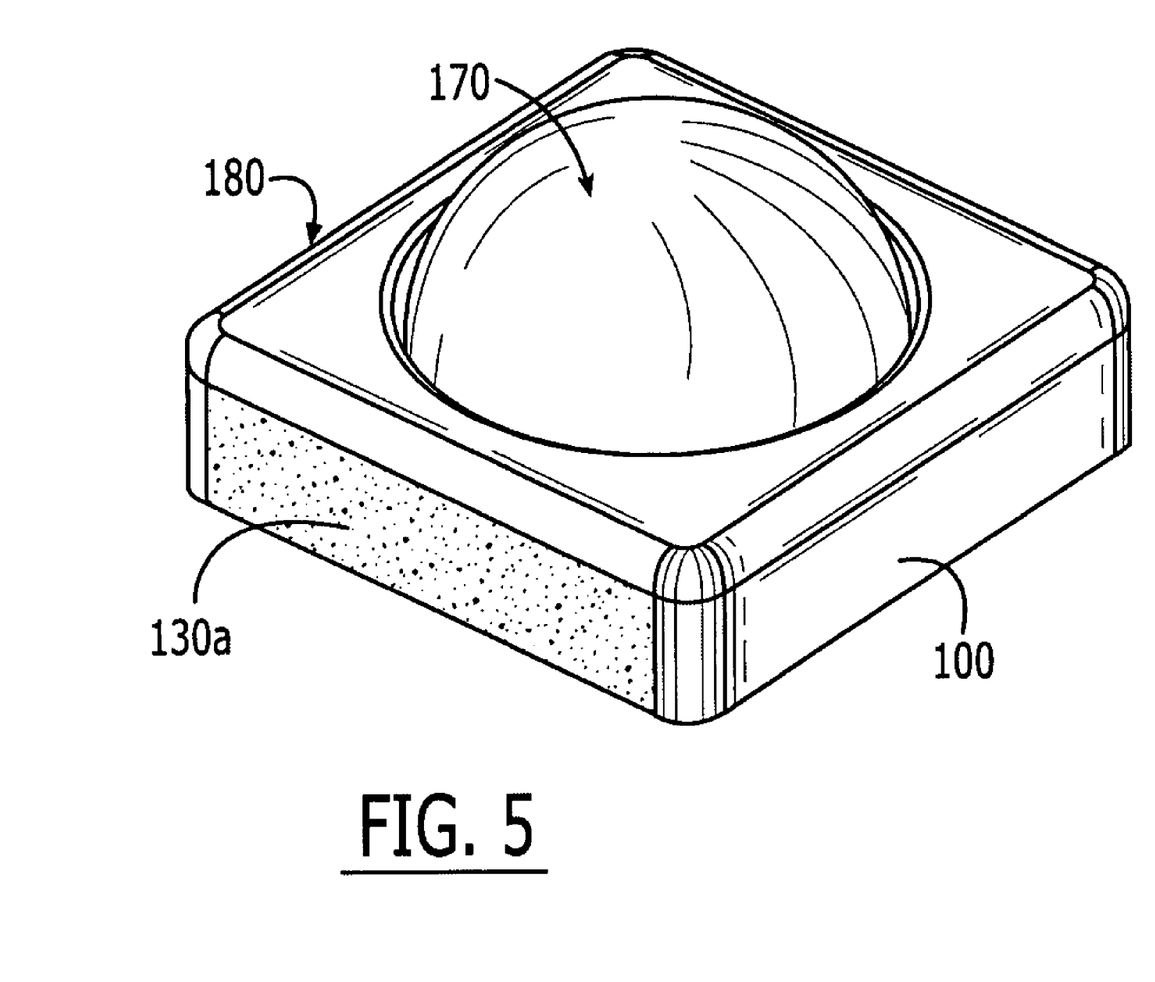
FIG. 5 is an assembled perspective view of a packaged semiconductor light emitting device according to embodiments of the present invention.

FIG. 4 illustrates an exploded perspective view of other embodiments of the present invention, which may correspond to FIG. 1H. As shown in FIG. 4, the solid metal block 100 includes a cavity 110 therein, and a plurality of spaced apart electrical traces thereon. In FIG. 4, the first electrical trace 130a is shown. However, rather than a single second electrical trace, a plurality of second electrical traces 330a', 330b' and 330c' may be provided to connect to a plurality of semiconductor light emitting devices 150' that may be mounted in the cavity 110 to provide, for example, red, green and blue semiconductor light emitting devices for a white light source. The encapsulant 160 and lens retainer 180 are shown. Other configurations of lens retainers 180 can provide a ridge and/or other conventional mounting means for mounting a lens 170 on the solid metal block 100. It also will be understood that an epoxy or other glue may be used in a lens retainer 180. The lens retainer 180 may also provide additional top heat sinking capabilities in some embodiments of the present invention. FIG. 5 illustrates the assembled package of FIG. 4.

Accordingly, some embodiments of the present invention use a solid block of aluminum as a mounting substrate for a semiconductor light emitting device. Aluminum has sufficient thermal conductivity to be used as an effective heat sink. Additionally, the cost of the material and the cost to fabricate can be low. Moreover, the ability to grow high quality insulating oxides allows the desired electrical traces to be formed without a severe impact on the thermal resistance, since the thickness of the anodic oxidation can be precisely controlled. This insulating layer also can be selectively patterned, which can allow the addition of another plated metal to the substrate, such as plating silver on the cavity sidewalls only, for increased optical performance.

The ability to form an optical cavity in the substrate, rather than a separate reflector cup, can reduce the assembly costs, since the total number of elements for the package can be reduced. Additionally, the fact that the reflector (cavity) position is fixed with respect to the substrate can also reduce the assembly complexity. Embodiments of the invention may be particularly useful for high power semiconductor light emitting devices such as high power LEDs and/or laser diodes.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A mounting substrate for a semiconductor light emitting device comprising:
a solid aluminum block including a cavity in a first face thereof that is configured for mounting the semiconductor light emitting device therein;
a conformal insulating coating comprising aluminum oxide on a surface of the solid aluminum block, and in the cavity; and
first and second spaced apart conductive traces on the conformal insulating coating in the cavity that are configured for connection to the semiconductor light emitting device;
wherein the first and second spaced apart conductive traces extend from the cavity to the first face, around at least one side of the aluminum block and onto a second face of the aluminum block that is opposite the first face.

2. A mounting substrate according to claim 1 wherein the first and second spaced apart conductive traces on the conformal insulating coating in the cavity comprise reflective material.

3. A mounting substrate according to claim 1 in combination with the semiconductor light emitting device that is mounted in the cavity and is connected to the first and second spaced apart conductive traces.

4. A mounting substrate according to claim 3 in further combination with a lens that extends across the cavity.

5. A mounting substrate according to claim 4 in further combination with an encapsulant between the semiconductor light emitting device and the lens.

6. A mounting substrate according to claim 4 in further combination with a lens retainer on the solid aluminum block that is configured to hold the lens across the cavity.

7. A mounting substrate for a semiconductor light emitting device comprising:
a solid aluminum block including a cavity in a first face thereof that is configured for mounting the semiconductor light emitting device therein;
a conformal insulating coating comprising aluminum oxide on a surface of the solid aluminum block, and in the cavity; and
first and second spaced apart conductive traces on the conformal insulating coating in the cavity that are configured for connection to the semiconductor light emitting device;
wherein the solid aluminum block includes therein first and second through holes that extend from the first face outside the cavity to a second face of the solid aluminum block that is opposite the first face, the respective first and second through holes including the conformal insulating coating thereon that comprises aluminum oxide and a respective first and second conductive via therein that extends from the first face outside the cavity to the second face and wherein a respective one of the spaced apart conductive traces is electrically connected to a respective one of the conductive vias.

8. A mounting substrate according to claim 7 further comprising third and fourth spaced apart conductive traces on the second face of the solid aluminum block, a respective one of which is connected to a respective one of the conductive vias.

9. A mounting substrate according to claim 7 in combination with the semiconductor light emitting device that is mounted in the cavity and is connected to the first and second spaced apart conductive traces.

10. A mounting substrate according to claim 9 in further combination with a lens that extends across the cavity.

11. A mounting substrate according to claim 10 in further combination with an encapsulant between the semiconductor light emitting device and the lens.

12. A mounting substrate according to claim 10 in further combination with a lens retainer on the solid aluminum block that is configured to hold the lens across the cavity.

13. A light emitting device comprising:
a solid aluminum block including a cavity in a first face thereof and a conformal aluminum oxide coating on a surface thereof including in the cavity;
first and second spaced apart conductive traces on the conformal aluminum oxide coating in the cavity;
a semiconductor light emitting device that is mounted in the cavity and is connected to the first and second spaced apart conductive traces;
a lens that extends across the cavity; and
an encapsulant between the semiconductor light emitting device and the lens;
wherein the first and second spaced apart conductive traces extend from the cavity to the first face, around at least one side of the solid aluminum block and onto a second face of the solid aluminum block that is opposite the first face.

14. A light emitting device according to claim 13 wherein the first and second spaced apart conductive traces on the conformal aluminum oxide coating in the cavity comprise reflective material.

15. A light emitting device comprising:
a solid aluminum block including a cavity in a first face thereof and a conformal aluminum oxide coating on a surface thereof including in the cavity;
first and second spaced apart conductive traces on the conformal aluminum oxide coating in the cavity;
a semiconductor light emitting device that is mounted in the cavity and is connected to the first and second spaced apart conductive traces;
a lens that extends across the cavity; and
an encapsulant between the semiconductor light emitting device and the lens;
wherein the solid aluminum block includes first and second through holes that extend from the first face outside the cavity to a second face of the solid aluminum block that is opposite the first face, the respective first and second through holes including the conformal aluminum oxide coating thereon and a respective first and second conductive via therein that extends from the first face outside the cavity to the second face and wherein a respective one of the spaced apart conductive traces is electrically connected to a respective one of the conductive vias.

16. A light emitting device according to claim 15 further comprising third and fourth spaced apart conductive traces on the second face of the solid aluminum block, a respective one of which is connected to a respective one of the conductive vias.

17. A mounting substrate for a semiconductor light emitting device comprising:

a block including a cavity in a first face thereof that is configured for mounting the semiconductor light emitting device therein;

a conformal insulating coating on a surface of the block and in the cavity; and first and second spaced apart conductive traces on the conformal insulating coating in the cavity that are configured for connection to the semiconductor light emitting device;

wherein the first and second spaced apart conductive traces extend from the cavity to the first face, around at least one side of the block and onto a second face of the block that is opposite the first face.

18. A mounting substrate according to claim 17 wherein the first and second spaced apart conductive traces on the conformal insulating coating in the cavity comprise reflective material.

19. A mounting substrate according to claim 17 in combination with the semiconductor light emitting device that is mounted in the cavity and is connected to the first and second spaced apart conductive traces.

20. A mounting substrate according to claim 17 in further combination with a lens that extends across the cavity.

21. A mounting substrate according to claim 20 in further combination with an encapsulant between the semiconductor light emitting device and the lens.

22. A mounting substrate according to claim 17 in further combination with a lens retainer on the block that is configured to hold the lens across the cavity.

23. A mounting substrate for a semiconductor light emitting device comprising:

a block including a cavity in a first face thereof that is configured for mounting the semiconductor light emitting device therein;

a conformal insulating coating on a surface of the block and in the cavity; and first and second spaced apart conductive traces on the conformal insulating coating in the cavity that are configured for connection to the semiconductor light emitting device;

wherein the block includes therein first and second through holes that extend from the first face outside the cavity to a second face of the block that is opposite the first face, the respective first and second through holes including the conformal insulating coating thereon and a respective first and second conductive via therein that extends from the first face outside the cavity to the second face and wherein a respective one of the spaced apart conductive traces is electrically connected to a respective one of the conductive vias.

24. A mounting substrate according to claim 23 further comprising third and fourth spaced apart conductive traces on the second face of the block, a respective one of which is connected to a respective one of the conductive vias.

25. A mounting substrate according to claim 23 in combination with the semiconductor light emitting device that is mounted in the cavity and is connected to the first and second spaced apart conductive traces.

26. A mounting substrate according to claim 25 in further combination with a lens that extends across the cavity.

27. A mounting substrate according to claim 26 in further combination with an encapsulant between the semiconductor light emitting device and the lens.

28. A mounting substrate according to claim 26 in further combination with a lens retainer on the block that is configured to hold the lens across the cavity.

* * * * *